(12) United States Patent
Kono

(10) Patent No.: US 7,804,580 B2
(45) Date of Patent: Sep. 28, 2010

(54) IMMERSION EXPOSURE APPARATUS AND METHOD OF MANUFACTURING A SEMICONDUCTOR DEVICE

(75) Inventor: Takuya Kono, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 124 days.

(21) Appl. No.: 12/116,350

(22) Filed: May 7, 2008

(65) Prior Publication Data

US 2008/0278703 A1 Nov. 13, 2008

(30) Foreign Application Priority Data

May 11, 2007 (JP) .............................. 2007-126943

(51) Int. Cl.
G03B 27/42 (2006.01)
G03B 27/52 (2006.01)
(52) U.S. Cl. .......................................... 355/53; 355/30
(58) Field of Classification Search ................... 355/30, 355/52, 53, 55, 67; 250/548; 356/399–401
See application file for complete search history.

(56) References Cited

U.S. PATENT DOCUMENTS

| | | | | |
|---|---|---|---|---|
| 5,825,043 | A * | 10/1998 | Suwa | 250/548 |
| 6,552,775 | B1 * | 4/2003 | Yanagihara et al. | 355/55 |
| 7,242,455 | B2 * | 7/2007 | Nei et al. | 355/53 |
| 7,388,649 | B2 * | 6/2008 | Kobayashi et al. | 355/53 |
| 2006/0187432 | A1 * | 8/2006 | Yasuda et al. | 355/53 |

FOREIGN PATENT DOCUMENTS

| | | |
|---|---|---|
| JP | 6-349708 | 12/1994 |
| JP | 2005-197276 | 7/2005 |
| JP | 2005-268747 | 9/2005 |
| JP | 2007-48857 | 2/2007 |
| JP | 2007-115758 | 5/2007 |
| WO | WO99/49504 * | 9/1999 |
| WO | WO 2005/057635 | 6/2005 |
| WO | WO 2006/118258 A1 | 11/2006 |

OTHER PUBLICATIONS

Japanese Notice of Reasons for Rejection Mailed Jul. 21, 2009, in Counterpart Application No. 2007-126943 (6 pages including translation).

* cited by examiner

Primary Examiner—Hung Henry Nguyen
(74) Attorney, Agent, or Firm—Finnegan, Henderson, Farabow, Garrett & Dunner, L.L.P.

(57) ABSTRACT

An immersion exposure apparatus includes a placement unit on which a substrate is to be placed, the substrate including a body to be processed and a resist film on the body, a projection optical system including a projection lens, a liquid supply unit including an immersion nozzle, a measurement unit for measuring positions of alignment marks Mi (i=1, 2, . . . ) on the substrate, and a control unit for controlling a position of the placement unit on which the substrate is placed so that a pattern image of the photo mask is projected onto a predetermined position on the substrate when immersion exposure to the substrate is performed based on a measurement value acquired by the measurement unit and a correction value for correcting a measurement error resulting from a change of a measurement environment caused during measurement of alignment marks Mi.

11 Claims, 8 Drawing Sheets

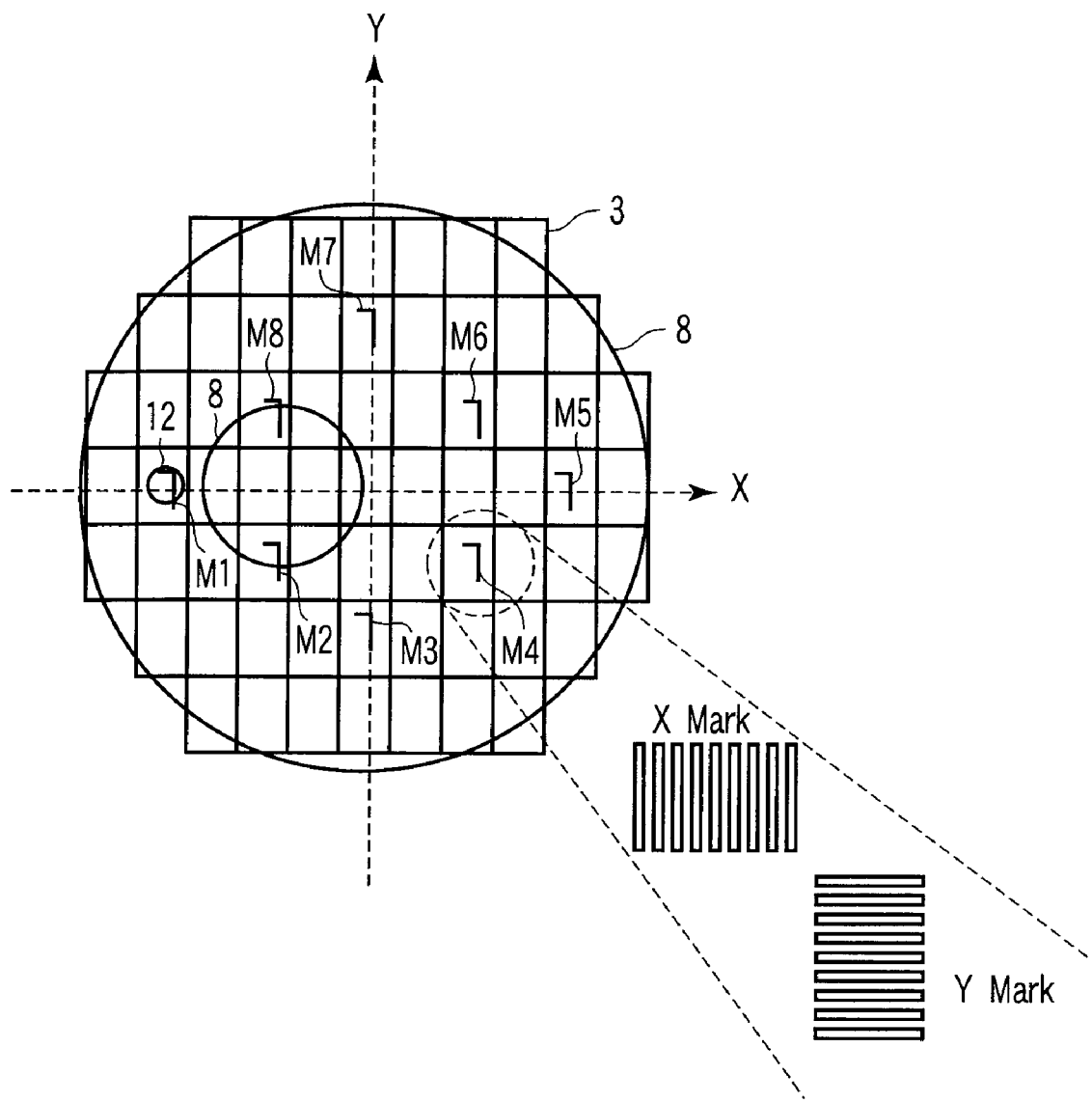
F I G. 2

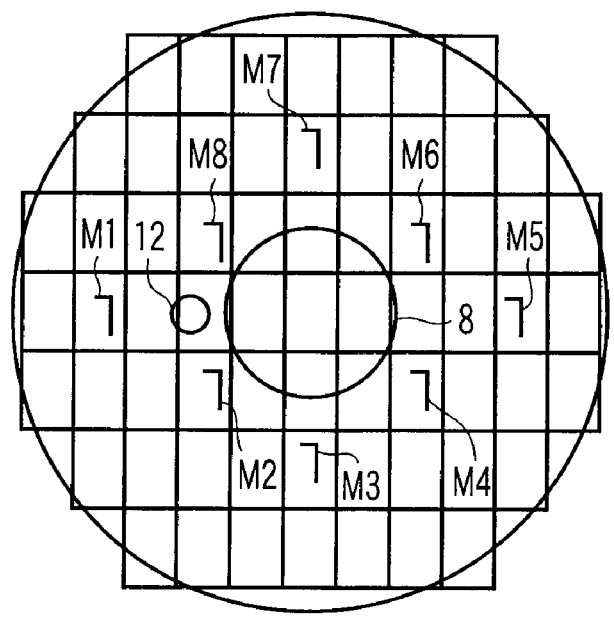
F I G. 5
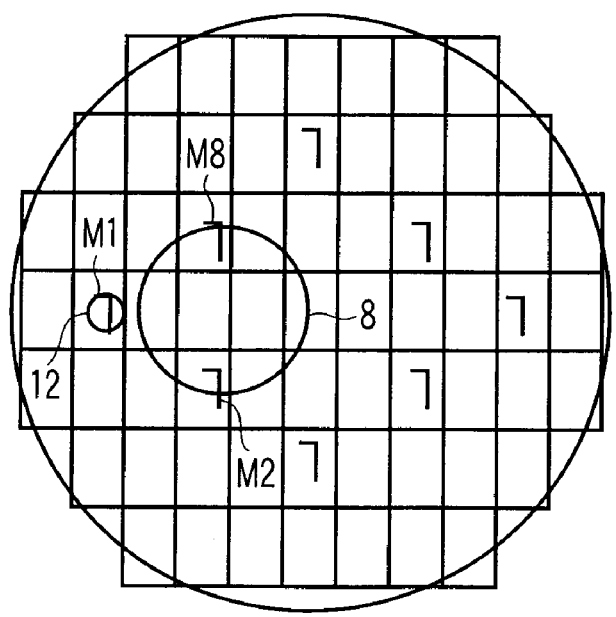
F I G. 6

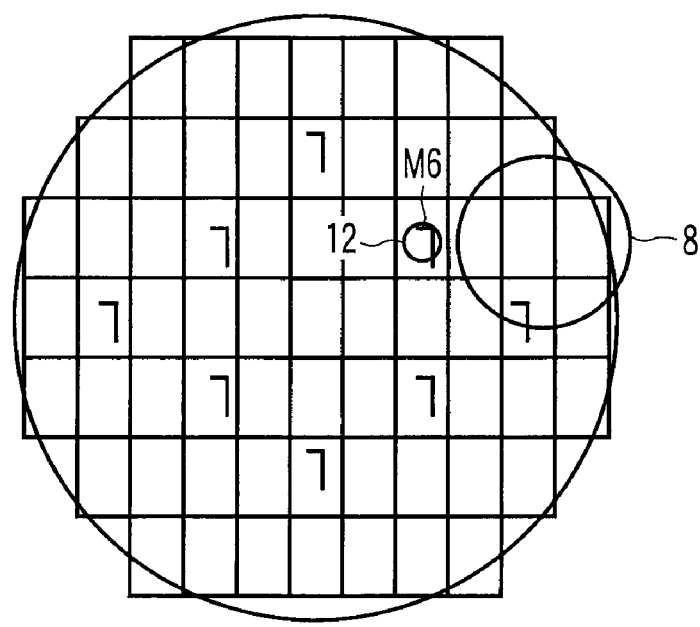
F I G. 11
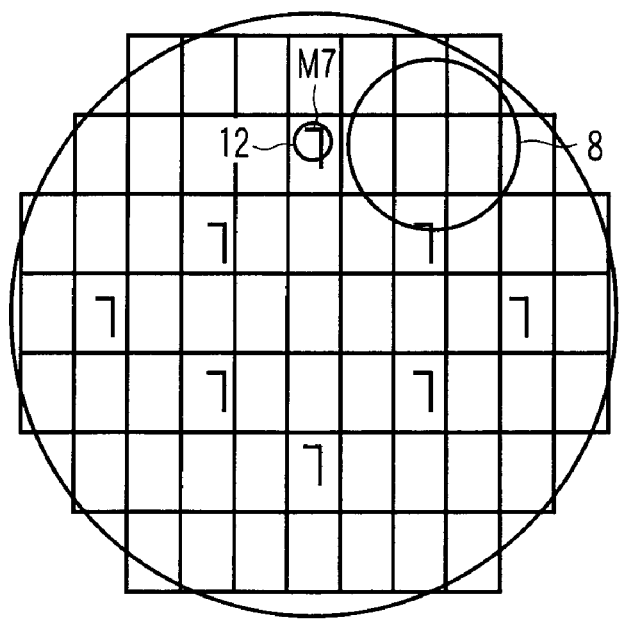
F I G. 12

IMMERSION EXPOSURE APPARATUS AND METHOD OF MANUFACTURING A SEMICONDUCTOR DEVICE

CROSS-REFERENCE TO RELATED APPLICATIONS

This application is based upon and claims the benefit of priority from prior Japanese Patent Application No. 2007-126943, filed May 11, 2007, the entire contents of which are incorporated herein by reference.

BACKGROUND OF THE INVENTION

1. Field of the Invention

The present invention relates to an immersion exposure apparatus used for manufacturing a semiconductor device and a method of manufacturing a semiconductor device.

2. Description of the Related Art

An immersion exposure apparatus, which projects a pattern onto a substrate while filling between a projection lens and the substrate with liquid, is developed (Jpn. Pat. Appln. KOKAI Publication No. 2007-48857). The immersion exposure apparatus includes an immersion nozzle, and the liquid is supplied onto the substrate by the nozzle.

Alignment measurement of the immersion exposure apparatus is carried out before exposure. This the same as a conventional exposure apparatus, which fills between a distal end of a projection lens and a substrate with air. However, the alignment measurement of the immersion exposure apparatus is carried out in a state that the immersion nozzle is held by liquid.

Based on the alignment measurement, an alignment correction value is calculated. Based on the calculated alignment correction value, the positional relationship between the substrate and a photo mask is corrected. After such an alignment correction, the substrate is exposed.

However, the conventional immersion exposure apparatus has a problem that even if alignment correction is made, a pattern is not projected onto a desired position on the substrate.

BRIEF SUMMARY OF THE INVENTION

According to an aspect of the present invention, there is provided an immersion exposure apparatus comprising: an illumination optical system including a light source for illuminating a pattern formed on a photo mask; a placement unit on which a substrate is to be placed, the substrate including a body to be processed and a resist film formed on the body to be processed; a projection optical system including a projection lens for projecting a pattern image of the photo mask onto the resist film; a liquid supply unit including an immersion nozzle for supplying a liquid onto a partial area of the substrate so that the liquid is filled between the substrate and the projection lens when the projection optical system projects the pattern image of the photo mask onto the resist film; a measurement unit configured to measure each position of a plurality of alignment marks Mi (i=1, 2, . . . ) formed on the substrate for aligning the photo mask and the substrate; and a control unit configured to control a position of the placement unit on which the substrate is placed so that the pattern image of the photo mask is projected onto a predetermined position on the substrate when immersion exposure to the substrate is performed based on a measurement value acquired by the measurement unit and a correction value for correcting a measurement error resulting from a change of a measurement environment caused during measurement of the alignment marks Mi.

According to an aspect of the present invention, there is provided a method of manufacturing a semiconductor device comprising: aligning a substrate and a photo mask, the substrate including a body to be processed and a resist film formed on the body; supplying a liquid onto a partial area of the substrate using an immersion nozzle so that the liquid is filled between the substrate and a projection lens, and performing immersion exposure to the resist film via the liquid; forming a resist pattern by developing the resist film; wherein aligning the substrate with the photo mask includes: measuring each position of a plurality of alignment marks Mi (i=1, 2, . . . ) formed on the substrate; and controlling a position of the placement unit on which the substrate is placed so that a pattern image of the photo mask is projected onto a predetermined position on the substrate when immersion exposure to the substrate is performed based on a measurement value acquired by measuring each position of the alignment marks Mi and a correction value for correcting a measurement error resulting from a change of a measurement environment caused during measurement of the alignment marks Mi.

BRIEF DESCRIPTION OF THE SEVERAL VIEWS OF THE DRAWING

FIG. 2 is a top view schematically showing a substrate and an immersion nozzle

FIG. 5 is a view showing initial positions of an immersion nozzle and an alignment sensor;

FIG. 6 is a view showing positions of an immersion nozzle and a alignment sensor when an alignment mark M1 is measured;

FIG. 11 is a view showing positions of an immersion nozzle and a alignment sensor when an alignment mark M6 is measured;

FIG. 12 is view showing positions of an immersion nozzle and an alignment sensor when an alignment mark M7 is measured;

DETAILED DESCRIPTION OF THE INVENTION

Hereinafter, embodiments of the present invention will be described with reference to the drawings.

Figure 1:
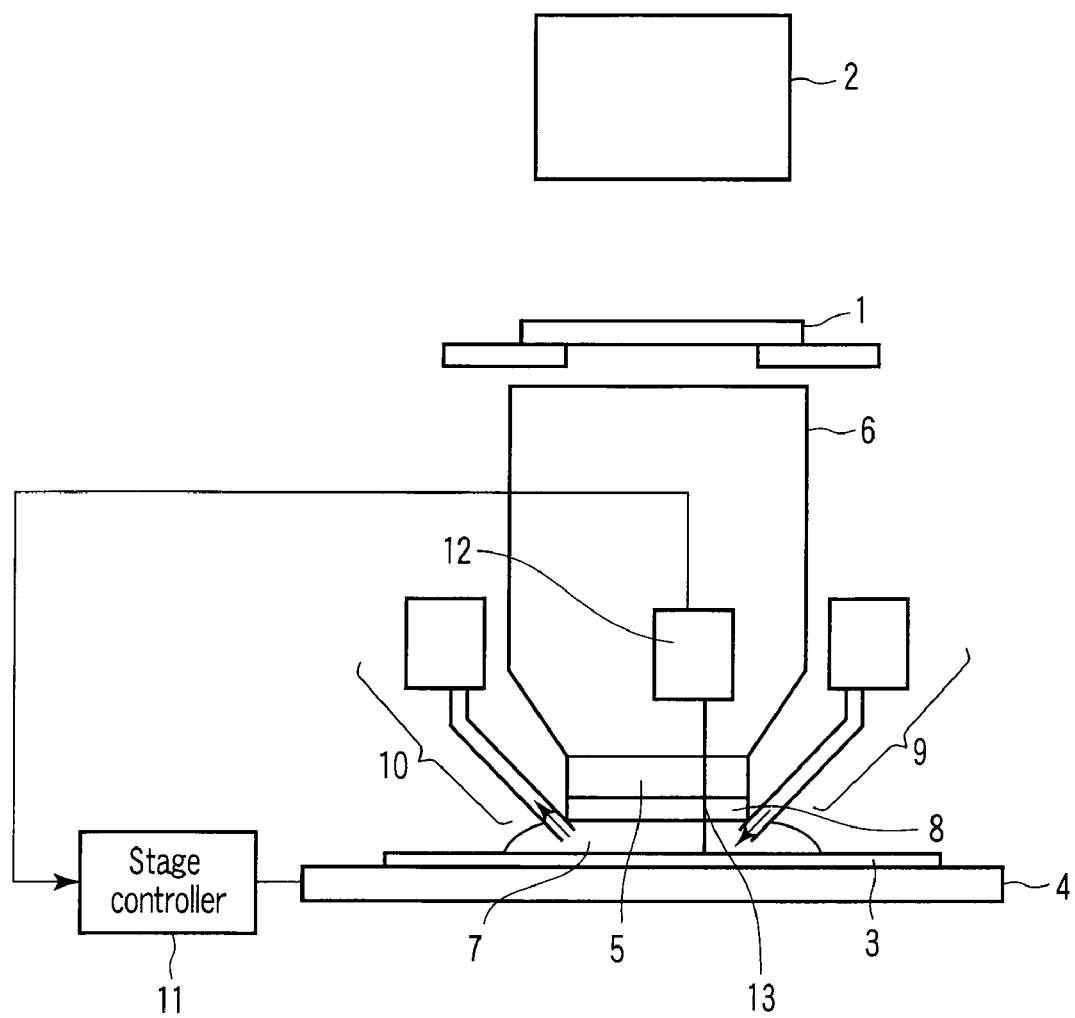
FIG. 1 is a view schematically showing an immersion exposure apparatus according to an embodiment.

FIG. 1 is a view schematically showing an immersion exposure apparatus according to an embodiment.

The immersion exposure apparatus of the embodiment comprises an illumination optical system 2 including a light source (exposure light source) for illuminating a photo mask 1, an X-Y state 4 (placement unit) on which a substrate 3 is placed, a projection optical system 6 including a projection lens 5 for projecting a pattern image of the photo mask 1 illuminated by the light source onto the substrate 3, an immersion nozzle 8 for supplying a liquid 7 onto a partial area of the substrate 3 so that space between the substrate 3 and a distal end of the projection lens 5 is filled with the liquid (immersion liquid) 7 when the pattern image of the photo mask 1 is projected onto the substrate 3, a liquid supply device (liquid supply unit) 9 for supplying the liquid 7 to the immersion nozzle 8, a liquid drain device (liquid drain unit) 10 for discharging the liquid on the substrate 3, a state controller (control unit) 11 for controlling a position of the X-Y stage 4, and an alignment sensor (measurement unit) 12 for performing alignment measurement.

The light source is an ultraviolet light source such as KrF light source and Arf light source. The liquid is, typically, pure water. The space between the substrate 3 and the distal end of the projection lens 5 is filled with clean liquid 7 by the liquid supply 9 and the liquid drain device 10.

The uppermost layer of the substrate is usually a resist film. A substrate to be processed exists under the resist film. The substrate is a semiconductor substrate such as a Si wafer, an insulating film formed on a semiconductor substrate, a semiconductor film formed on a semiconductor substrate or a conductive film formed on a semiconductor substrate. The alignment sensor 12 is a well-known sensor using light (alignment light).

Pattern exposure to the substrate 3 is carried out in the following manner. An exposure light generated from the light source is irradiated onto the photo mask 1. Then, the exposure light passing through the photo mask 1 is irradiated onto the substrate placed on the X-Y stage 4 via the projection lens 5 and the liquid 7.

At the time of the pattern exposure, the liquid 7 is supplied and discharged by the liquid supply and drain devices 9 and 10 while the substrate 3 placed on the X-Y stage 4 is moved along a predetermined direction. Such an immersion exposure is successively carried out, thereby, the whole of the exposure areas is exposed.

Alignment correction is made prior to the pattern exposure. The conventional immersion exposure apparatus has the problem described before. That is, even if the alignment correction is made, a pattern is not projected on a desired position.

Inventors of the present application have earnestly studied; as a result, they found that the problem results from alignment measurement. The point will be hereinafter described.

FIG. 2 is a top view schematically showing the substrate 3 and the immersion nozzle 8.

Alignment marks M1 to M8 are provided on the substrate 3. Each of the alignment marks M1 to M8 is composed of an X mark and a Y mark. As seen from an enlarged illustration in FIG. 2, the X mark comprises a plurality of line patterns arrayed in the X direction. On the other hand, the Y mark comprises a plurality of line patterns arrayed in the Y direction.

The alignment sensor 12 is connected so that it is arranged outside the immersion nozzle 8. The alignment sensor is moved by moving the immersion nozzle 8. The immersion nozzle 8 is held by liquid in not only exposure but also in alignment measurement.

As shown in FIG. 2, overlapping portion of the substrate 3 with the immersion nozzle 8 becomes large.

The alignment sensor 12 measures each position of the alignment marks M1 to M8. The measurement is made in the named order of alignment marks M1, M2, M3, M4, M5, M6, M7 and M8.

Here, as seen from FIG. 2, the immersion nozzle 8 passes through alignment marks M2 and M8 when a position of the alignment mark M1 is measured because the area of the immersion nozzle is large.

At this time, as movement (scan speed) of the immersion nozzle 8 is fast, a part of liquid on alignment marks M2 and M8, which are not still measured is vaporized. The vaporization is a factor of causing air drift between the substrate 3 and the alignment sensor 12 and temperature change of the substrate 3.

The air drift changes an optical path of light (alignment light) 13 emitted from the alignment sensor 12 and an optical path of light reflected on the substrate 3 (change of measurement environment). The change of the optical path gives an error to the measured result of the alignment mark M1.

The temperature change changes a volume of the substrate 3 (change of measurement environment). The change of the volume gives an error to the measured result of the alignment mark M1. The change of volume by the temperature change is variable depending on time that the surface of the substrate 3 is covered with the liquid 7.

In this manner, depending on the arrangement of the alignment marks, when a certain alignment mark is measured, the measurement environment may be changed because the immersion nozzle passes over alignment marks to be measured later. The change of the measurement environment gives an error to the measured result of the alignment measurement.

The error is reflected to an alignment correction value calculated based on a measured value of the alignment measurement. That is, an erroneous alignment correction value is calculated.

The present inventors confirmed that a pattern is not projected onto a desired position on the substrate if alignment correction is made based on the measurement result including the error mentioned above.

Therefore, according to the present embodiment, a correction value is given to the measured value of the alignment measurement considering a change of measurement environment causing during alignment mark measurement. The following is a description of a method of considering a change of volume of the substrate accompanied by the temperature change of the substrate 3. In this case, the substrate 3 is given as a substrate including a wafer and a resist film (uppermost layer). A film to be processed (body to be processed) exists under the resist film. The film to be processed is an insulating film, a conductive film or a semiconductor film. In this case, the wafer and the film to be processed form the substrate.

Figure 3:
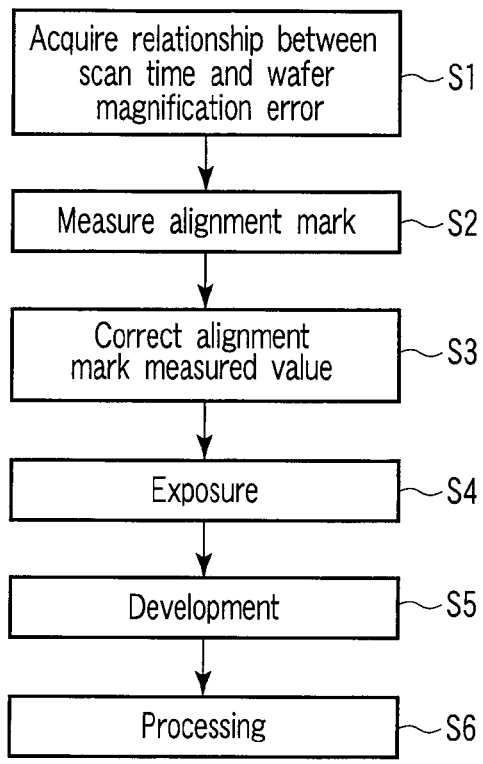
FIG. 3 is a flowchart to showing a method of manufacturing a semiconductor device according to an embodiment.

FIG. 3 is a flowchart showing a method of manufacturing a semiconductor device (step S1 to S7) according to the present embodiment. Steps S1 to S4 show an exposure method according to the present embodiment.

[S1]

In the case of a wafer, wafer magnification is given as one of the change of volume. The wafer magnification is given to each of X and Y directions. For example, the wafer magnification changes depending on the number of times (scan time) that the immersion nozzle 8 passes over an alignment mark Mi before measurement of alignment mark Mi (i=1, 2, . . . , 8)

Figure 4:
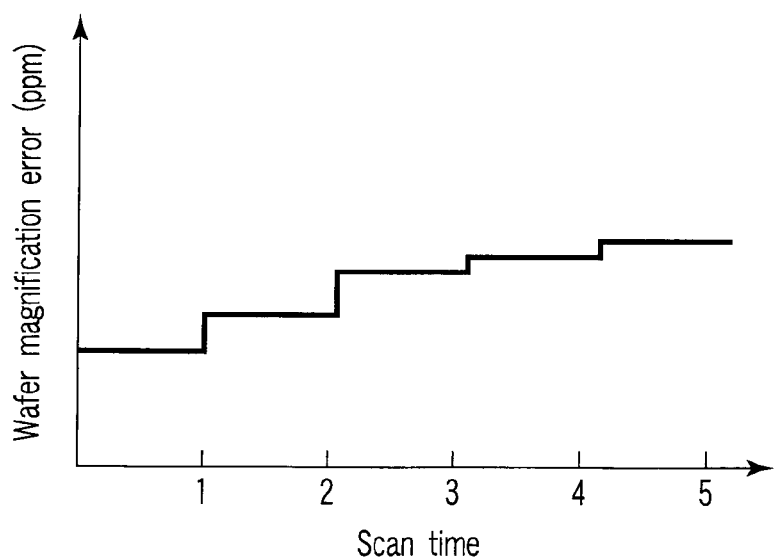
FIG. 4 is a graph showing a relationship between a scan time and a wafer magnification error.

Thus, the relationship (correction value) between the scan times and a wafer magnification error is previously acquired by actual measurement or calculation. The relationship (correction value) between the scan times and the wafer magnification error is inputted to the stage controller 11. The wafer magnification error is determined with reference to wafer magnification of a wafer whose surface is not immersed in liquid. FIG. 4 is a graph showing the relationship between the scan times and the wafer magnification error. This graph of FIG. 4 shows a wafer magnification error in the X direction.

[S2]

Positions of alignment marks M1 to M8 are measured using the immersion exposure apparatus shown in FIG. 1 in the same manner as the conventional case. The measured results are inputted to the stage controller 11.

Here, the measurement is made in the named order of alignment marks M1 to M8. FIG. 5 is a view showing the initial positions of the immersion nozzle 8 and the alignment sensor 12. FIGS. 6 to 13 are views showing positions of the immersion nozzle 8 and the alignment sensor 12 at the time of measurement of alignment marks M1 to M8. FIGS. 5 to 13 are given as one example, and positions of the immersion nozzle 8 and the alignment sensor 12 is not limited to those.

[S3]

Base on the relationship between the scan time and the wafer magnification, correction values for the measured value of the alignment marks M1-M8 are acquired by the stage controller 11. The correction value is acquired in the following manner.

When the alignment mark M1 is measured, the immersion nozzle 8 passes over alignment marks M2 and M8, which are not still measured (FIG. 6).

Figure 7:
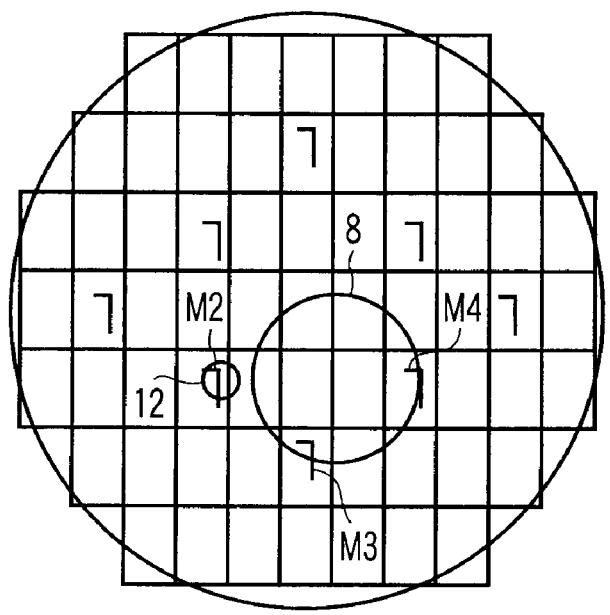
FIG. 7 is a view showing positions of an immersion nozzle and a alignment sensor when an alignment mark M2 is measured.

When the alignment mark M2 is measured, the immersion nozzle 8 passes over alignment marks M3 and M4, which are not still measured (FIG. 7).

Figure 8:
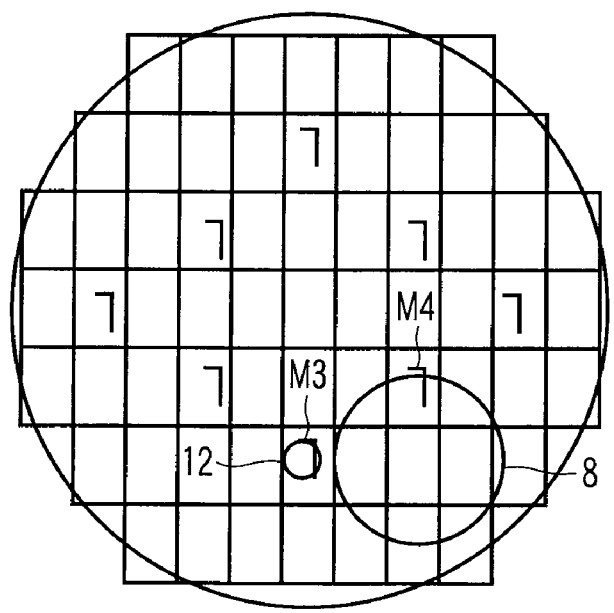
FIG. 8 is a view showing positions of an immersion nozzle and a alignment sensor when an alignment mark M3 is measured.

When the alignment mark M3 is measured, the immersion nozzle 8 passes over the alignment mark M4, which is not still measured (FIG. 8).

Figure 9:
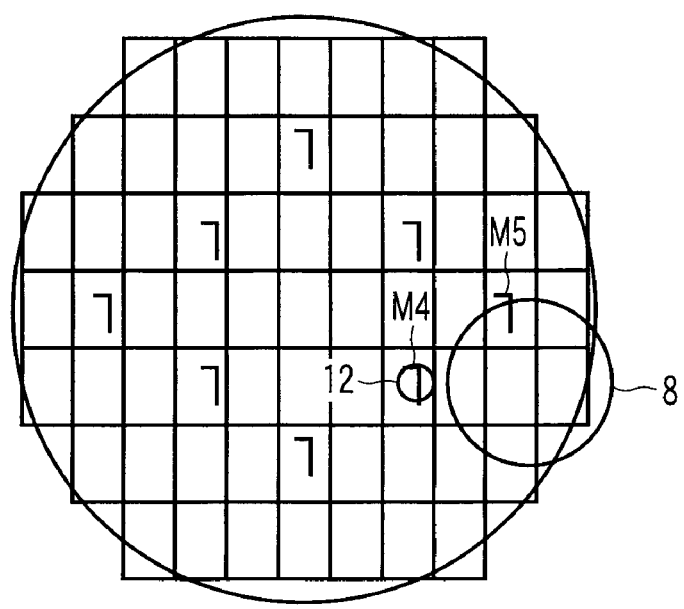
FIG. 9 is a view showing positions of an immersion nozzle and a alignment sensor when an alignment mark M4 is measured.

When the alignment mark M4 is measured, the immersion nozzle 8 passes over the alignment mark M5, which is not still measured (FIG. 9).

Figure 10:
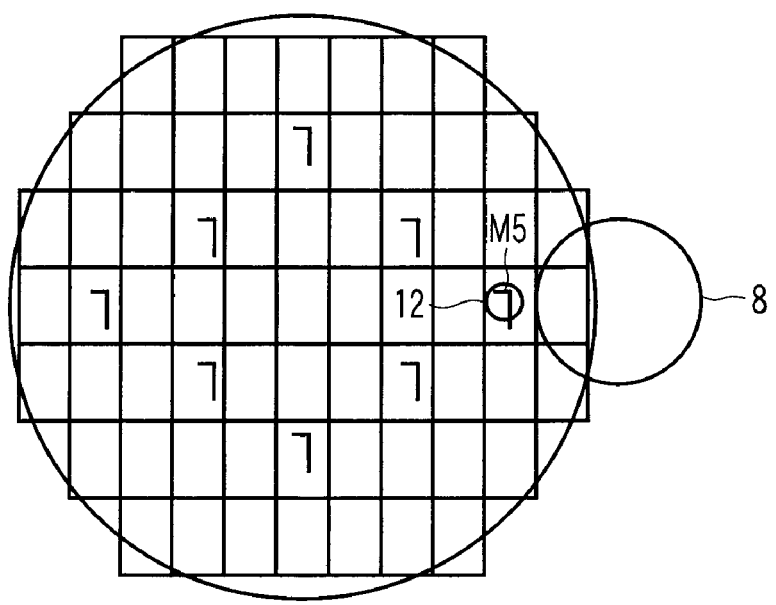
FIG. 10 is a view showing positions of an immersion nozzle and a alignment sensor when an alignment mark M5 is measured.
Figure 13:
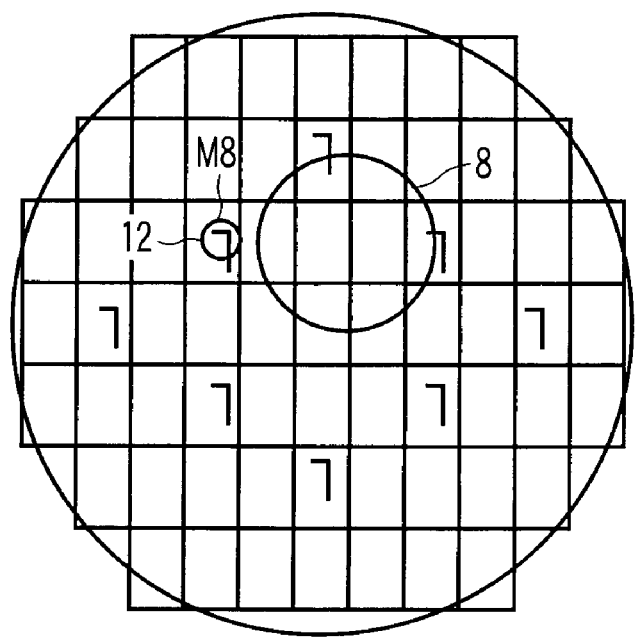
FIG. 13 is view showing positions of an immersion nozzle and a alignment sensor when an alignment mark M8 is measured.

When the alignment mark M5 is measured, the immersion nozzle 8 does not pass over alignment marks M6 to M8, which are not still measured (FIG. 10).

When the alignment mark M6 is measured, the immersion nozzle 8 does not pass over alignment marks M7 and M8, which are not still measured (FIG. 11).

When the alignment mark M7 is measured, the immersion nozzle 8 does not pass over the alignment mark M8, which is not still measured (FIG. 12).

Therefore, the number of times passing over the alignment mark Mi (scan times) before the measurement of the alignment mark Mi (i=1, 2, . . . , 8) is as follows. The scan times is one with respect to alignment marks M2 and M3. The scan times is two with respect to the alignment mark M4. The scan time is one with respect to the alignment mark M5. The scan time is zero with respect to the alignment marks M6 and M7. The scan time is one with respect to the alignment mark M8.

Measured values of alignment marks M1 to M8 are set as (Px1, Py1) to (Px8, Py8), and correction values of the number of scan times 1, 2 are set as ($\Delta x$, $\Delta y$), ($2\Delta x$, $2\Delta y$) (linear approximation). The measured values (Px1', Py1') to (Px8', Py8') of the corrected alignment marks M1 to M8 are as follows.

(Px1', Py1')=(Px1, Py1)
(Px2', Py2')=(Px2+$\Delta x$, Py2+$\Delta y$)
(Px3', Py3')=(Px3+$\Delta x$, Py3+$\Delta y$)
(Px4', Py4')=(Px4+$2\Delta x$, Py4+$2\Delta y$)
(Px5', Py5')=(Px5, Py5)
(Px6', Py6')=(Px6, Py6)
(Px7', Py7')=(Px7, Py7)
(Px8', Py8')=(Px8+$\Delta x$, Py8+$\Delta y$)

[S4]

Alignment for the photo mask 1 and the substrate 3 is carried out using corrected measured value of alignment marks M1 to M8 (alignment correction value), and thereafter, the substrate 3 is exposed.

According to the present embodiment, the correction values are given to the measured values of alignment measurement by considering the environment change caused during the alignment measurement (in the above example, at the time of measuring a certain alignment mark, correction values are given to the measured values of alignment measurement by considering the environment change caused by the immersion nozzle passing over the alignment marks measured later), thereby, the accuracy of the alignment correction value becomes high, and the pattern is prevented from being projected on a position displaced from the desired position on the substrate.

The wafer magnification also changes depending on time that the substrate 3 is immersed in liquid, in addition to the number of scan times.

Figure 14:
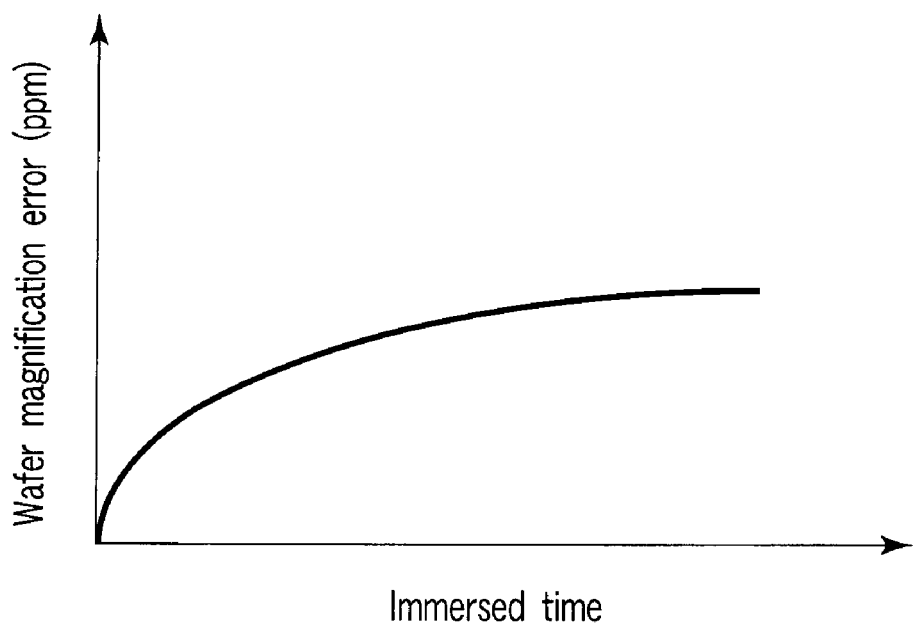
FIG. 14 is a graph showing a relationship between time that a wafer surface is immersed in liquid and wafer magnification error.

Therefore, instead of previously acquiring the relationship between the number of scan times and the wafer magnification error, as shown in FIG. 14, the relationship between the time that the surface of the wafer are immersed in liquid by the immersion nozzle 8 (immersed time) and the wafer magnification error may be previously acquired by actual measurement or calculation. The wafer magnification error is determined with reference to wafer magnification of a wafer whose surface is not immersed in liquid.

In this case, as the alignment marks measured later has been immersed in water longer time, a correction value is acquired by using the relationship between the immersed time and the wafer magnification error.

In addition, as the wafer magnification also changes depending on a flow rate of the immersion nozzle 8 at the time of alignment measurement, water pressure of the immersion nozzle at the time of alignment measurement or temperature of the substrate 3 at the time of alignment measurement, the relationship between the parameters and the wafer magnification error may be previously acquired.

In general, the higher the flow rate of the immersion nozzle 8 is, the larger the correction value becomes, the higher the water pressure of the immersion nozzle 8 is, the larger the correction value becomes, the higher the temperature of the substrate is, the larger the correction value becomes.

Further, the correction value may be calculated considering at least two or more of the parameters (number of scan times, immersed time, flow rate, water pressure, temperature).

In addition, the embodiment relates to correction on wafer magnification, the same correction is made with respect to other linear components such as wafer rotation, wafer orthogonal, wafer shift (components whose correction values is obtained by linear approximation) in the same manner. The same correction as above is made with respect to non-linearity.

After step S5, a step for developing the resist film (S6), a step for processing the film to be processed by etching using the developed resist film (resist pattern) as a mask (S6), and then the semiconductor device is obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An immersion exposure apparatus comprising:
   an illumination optical system including a light source for illuminating a pattern formed on a photo mask;
   a placement unit on which a substrate is to be placed, the substrate including a body to be processed and a resist film formed on the body to be processed;
   a projection optical system including a projection lens for projecting a pattern image of the photo mask onto the resist film;
   a liquid supply unit including an immersion nozzle for supplying a liquid onto a partial area of the substrate so that the liquid is filled between the substrate and the projection lens when the projection optical system projects the pattern image of the photo mask onto the resist film;
   a measurement unit configured to measure, in a state that the immersion nozzle is held by the liquid, each position of a plurality of alignment marks formed on the substrate for aligning the photo mask and the substrate; and
   a control unit configured to control a position of the placement unit on which the substrate is placed so that the pattern image of the photo mask is projected onto a predetermined position on the substrate when immersion exposure to the substrate is performed based on a measurement value acquired by the measurement unit and a correction value for correcting a measurement error resulting from a change of a measurement environment caused during measurement of the plurality of alignment marks,
   wherein the change of the measurement environment caused during the measurement of the plurality of alignment marks is an environment change caused, when a first alignment mark of the plurality of alignment marks is measured, by the immersion nozzle passing over a second alignment mark of the plurality of alignment marks to be measured after measuring the first alignment mark.

2. The apparatus according to claim 1, wherein the light source is a KrF light source or ArF light source.

3. The apparatus according to claim 1, wherein the liquid is pure water.

4. A method of manufacturing a semiconductor device comprising:
   aligning a substrate and a photo mask, the substrate including a body to be processed and a resist film formed on the body;
   supplying a liquid onto a partial area of the substrate using an immersion nozzle so that the liquid is filled between the substrate and a projection lens, and performing immersion exposure to the resist film via the liquid; and
   forming a resist pattern by developing the resist film,
   wherein aligning the substrate with the photo mask includes:
   measuring, in a state that the immersion nozzle is held by the liquid, each position of a plurality of alignment marks formed on the substrate, and
   controlling a position of the placement unit on which the substrate is placed so that a pattern image of the photo mask is projected onto a predetermined position on the substrate when immersion exposure to the substrate is performed based on a measurement value acquired by measuring each position of the plurality of alignment marks and a correction value for correcting a measurement error resulting from a change of a measurement environment caused during measurement of the plurality of alignment marks, wherein the change of the measurement environment caused during the measurement of the plurality of alignment marks is an environment change caused, when a first alignment mark of the plurality of alignment marks is measured, by the immersion nozzle passing over a second alignment mark of the plurality of alignment marks to be measured after measuring the first alignment mark.

5. The method according to claim 4, wherein the correction value is calculated based on at least one of a number of times that the immersion nozzle passes over a specific alignment mark of the plurality of alignment marks before the measurement of the specific alignment mark, time that the specific alignment mark is immersed in the liquid before the measurement of the specific alignment mark, flow rate of the liquid that discharges from the immersion nozzle before the measurement of the specific alignment mark, a hydraulic pressure of the liquid that discharges from the immersion nozzle before the measurement of the specific alignment mark and a temperature of the substrate before the measurement of the specific alignment mark.

6. The method according to claim 4, wherein the correction value is calculated from linear approximation of a shift from a predetermined position of one or more of the plurality of alignment marks.

7. The method according to claim 5, wherein the correction value is calculated from linear approximation of a shift from a predetermined position of one or more of the plurality of alignment marks.

8. The method according to claim 4, wherein the light source is a KrF light source or ArF light source.

9. The method according to claim 4, wherein the liquid is pure water.

10. The method according to claim 5, wherein the light source is a KrF light source or ArF light source.

11. The method according to claim 5, wherein the liquid is pure water.

* * * * *